United States Patent
Ohashi et al.

(10) Patent No.: US 6,853,321 B2
(45) Date of Patent: Feb. 8, 2005

(54) DIGITAL-TO-ANALOG CONVERTER

(75) Inventors: Toru Ohashi, Saitama-ken (JP); Yuji Yamamoto, Saitama-ken (JP)

(73) Assignee: Pioneer Corporation, Tokyo (JP)

( * ) Notice: Subject to any disclaimer, the term of this patent is extended or adjusted under 35 U.S.C. 154(b) by 0 days.

(21) Appl. No.: 10/625,691

(22) Filed: Jul. 24, 2003

(65) Prior Publication Data

US 2004/0119623 A1 Jun. 24, 2004

(30) Foreign Application Priority Data

Jul. 25, 2002 (JP) .................................. 2002-216959

(51) Int. Cl.7 ............................................. H03M 1/66
(52) U.S. Cl. ...................................... 341/144; 341/143
(58) Field of Search ................................ 341/118, 120, 341/143, 144; 375/142, 148, 238, 295, 298, 324, 348, 350

(56) References Cited

U.S. PATENT DOCUMENTS

| | | | |
|---|---|---|---|
| 3,798,376 A | | 3/1974 | Limberg |
| 5,087,914 A | * | 2/1992 | Sooch et al. ............... 341/120 |
| 5,307,064 A | | 4/1994 | Kudoh |
| 5,646,621 A | * | 7/1997 | Cabler et al. .............. 341/143 |
| 5,764,171 A | * | 6/1998 | Stikvoort ................... 341/143 |
| 6,124,816 A | * | 9/2000 | Lee et al. .................. 341/144 |
| 6,204,789 B1 | * | 3/2001 | Nagata ...................... 341/144 |
| 6,621,434 B2 | * | 9/2003 | Barry et al. ............... 341/141 |
| 6,697,002 B2 | * | 2/2004 | Sekiya et al. ............. 341/143 |

FOREIGN PATENT DOCUMENTS

| | | |
|---|---|---|
| DE | 37 28 125 A1 | 3/1989 |
| EP | 0 616 313 A1 | 9/1994 |
| GB | 2 018 065 A | 10/1979 |

* cited by examiner

Primary Examiner—Michael Tokar
Assistant Examiner—Linh Van Nguyen
(74) Attorney, Agent, or Firm—Arent Fox PLLC

(57) ABSTRACT

A D/A converter includes a ΔΣmodulator applying Delta-Sigma modulation to a digital signal in order to generate a code sequence, and first and second post-filters as a first-order analog low-pass filter, respectively, which is connected in cascade to the subsequent stage of the modulator, in which low-pass filtering on the code sequence is executed so as to output an analog signal. The post-filter is set to have a cutoff frequency which falls in the frequency range from fca to fHa, where the fca is a cutoff frequecy of the post-filter 11 and the fHa is a maximum frequency thereof. Since the respective attenuation characteristics of post-filters are synthesized, an overall attenuation characteristic between the both filters is able to have the characteristics of a desired second-order filter. The synthesized attenuation characteristic allows the D/A converter to simultaneously execute processing such as de-emphasis in the frequency range between the both cutoff frequency, and elimination of high-frequency noises over the frequency range of the cutoff frequency. As a result, the D/A converter with a small circuit scale can be provided.

10 Claims, 4 Drawing Sheets

DIGITAL-TO-ANALOG CONVERTER

BACKGROUND OF THE INVENTION

The present invention relates to a digital-to-analog converter (hereinafter, referred to as D/A converter).

The present application claims priority from Japanese Patent Application No. 2002-216959, the disclosure of which is incorporated herein by reference.

In recent years, so called "hybridization of technologies" which combines digital techniques with analog ones has been developed and advanced.

For example, in the case of a superheterodyne radio receiver which receives a broadcast from a radio station, at first the receiver converts an intermediate frequency signal (IF signal), which is provided by a frequency converter, into a digital signal. Then, using digital signal processing techniques the receiver carries processing for its signal such as noise-reduction, frequency discrimination, de-emphasis and attenuation. At last, the receiver converts its signal into an analog signal, which is applied to speakers or the like.

Moreover, digital circuits having advanced functions and analog circuits have been able to be formed together on a semiconductor integrated circuit device (LSI). Using such a LSI, the above-mentioned radio receiver can be implemented.

FIG. 1a shows a conventional structure of a semiconductor integrated circuit device 1, which has been proposed for the hybrid superheterodyne radio receiver.

The semiconductor integrated circuit device 1 includes a receiving section 2 into which a received signal Sin from an antenna is input, a de-emphasis circuit 3, a digital attenuator 4, a Δ Σmodulator (Delta-Sigma modulator) 6 and a post-filter 7.

The receiving section 2 includes analog circuits involving an RF amplifier and a frequency converter, an analog-to-digital converter (hereinafter referred to as A/D converter) which converts an intermediate frequency signal generated from the frequency converter into a digital signal, a frequency discriminator for discriminating the frequency of the digital signal with digital signal processing and a matrix circuit or the like.

Then, the digital signal, which is detected and generated with the above frequency discriminator and the matrix circuit, is applied to a de-emphasis circuit 3.

The de-emphasis circuit 3 de-emphasizes the digital signal, because the sounds reproduced from a so called "pre-emphasized signal at a radio station" without a process of de-emphasis are unnatural.

For example, as shown in FIG. 1b, the de-emphasis circuit 3 is formed of a first-order digital low-pass filter which has an attenuation characteristic G1 showing about 6 db/oct in attenuation in the range of frequencies higher than a predetermined cutoff frequency fc1 (specifically about 2–3 kHz). The de-emphasis circuit de-emphasizes the digital signal with the above attenuation characteristic.

The digital attenuator 4 adjusts the level of the de-emphasized digital signal. Then the level-adjusted digital signal is supplied to a D/A converter 5 composed of the Δ Σmodulator 6 and the post-filter 7.

The Δ Σmodulator 6 applies such a modulation as a Delta-Sigma modulation or a Sigma-Delta modulation to the digital signal output from the digital attenuator 4. The Δ Σmodulator 6 outputs code sequences to the post-filter 7, where the high-frequencies of the code sequences are eliminated so that analog voice signals Sout with reduced high-frequency noises are generated.

More precisely, the post-filter 7 is a higher-order low-pass filter implemented using Switched Capacitor Filter (SCF), and has an attenuation characteristic G2 of the low-pass filter in which the attenuation increases sharply with frequency in the frequency range over a predetermined cutoff frequency fc2 (specifically about 20–30 kHz) as shown in FIG. 1c. Due to this low-pass characteristic, the post-filter 7 generates voice signals Sout with the reduced high-frequency noises.

As mentioned above, in the case of the radio receiver also, so called "hybridization of technologies" that combines digital techniques with analog ones has been developed.

The hybridization of digital and analog technologies, as described above, has widely adopted such a type of the D/A converter 5 composed of the Δ Σmodulator 6 and the post-filter 7.

However, there occurs a problem that the circuit scale of the D/A converter 5 becomes large, because the post-filter 7 is constructed by the Switched Capacitor Filters. Further, when the D/A converter is fabricated by semiconductor integrated circuit devices, another high-cost problem occurs because of a large circuit scale of the post-filter 7.

The Switched Capacitor Filter is made of many resistors and capacitors to perform filtering function using charge coupled with specific time constants. Implementation of a D/A converter with semiconductor integrated circuit devices can make use of features of semiconductor fabrication process of being able to make resistors and capacitors with required high-accuracy. Because of this, the Switched Capacitor Filters are employed in a D/A converter.

The Switched Capacitor Filter requires many resistors, capacitors and many switching elements for charge coupling. This causes a problem of a large circuit scale.

Furthermore, D/A conversion of a pre-emphasized digital signal has caused a problem of a larger circuit scale to be required, because of requiring a de-emphasis circuit 3 (digital low-pass filter) at a preceding stage of the Δ Σmodulator 6 and the above mentioned post-filter 7 (Switched Capacitor Filter) at a subsequent stage of the Δ Σmodulator 6.

SUMMARY OF THE INVENTION

The object of the present invention is to solve the above-mentioned problems of prior arts, that is, to propose a new structure of a D/A converter.

In order to solve the problems as mentioned above, there is provided a D/A converter of the present invention converting a digital signal to an analog signal, comprising a modulator applying a Delta-Sigma modulation to the digital signal to generate a code sequence, a first post-filter having a first-order attenuation characteristic of performing low-pass filtering to the code sequence, and a second post-filter having another first-order attenuation characteristic of performing low-pass filtering to an output signal from the first post-filter and for outputting the processed analog signal, wherein the first and second post-filters have different cutoff frequencies.

BRIEF DESCRIPTION OF THE DRAWINGS

These and other objects and advantages of the present invention will become clear from the following description with reference to the accompanying drawings, wherein.

DETAILED DESCRIPTION OF THE PREFERRED EMBODIMENTS

Figure 2:
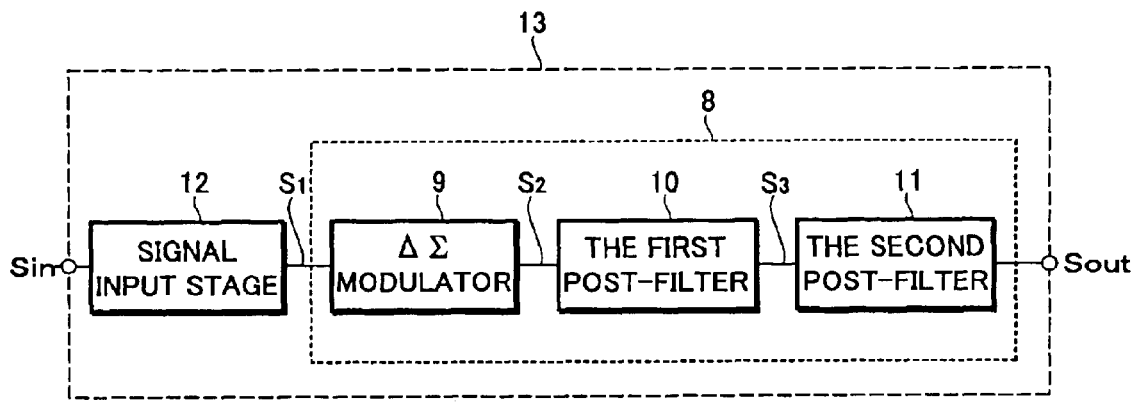
FIG. 2a and FIG. 2b show a structure and functions of the D/A converter according to an embodiment of the present invention.
Figure 2:
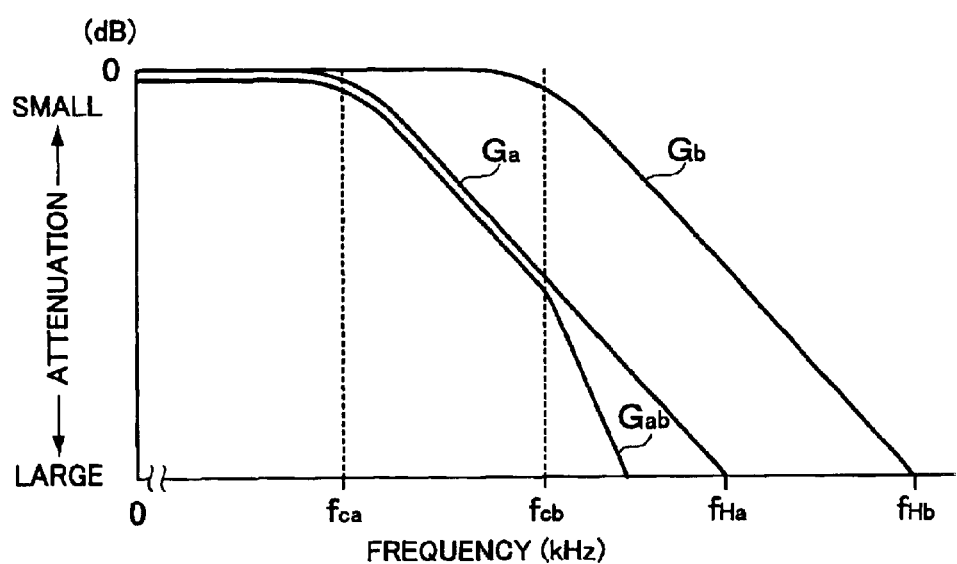

A preferred embodiment of the present invention will be explained referring to FIGS. 2a and 2b. FIG. 2a is a block diagram illustrating a structure of a D/A converter in the present embodiment, and FIG. 2b is a view for explaining functions of the D/A converter.

As illustrated in FIG. 2a, a D/A converter 8 includes a ΔΣmodulator 9 which applies Delta-Sigma modulation to a digital signal S1 to be D/A converted, a first post-filter 10 which applies low-pass filtering to a code sequence S2 output from the ΔΣmodulator 9, and a second post-filter 11 further applying low-pass filtering to the output signal S3 from the first post-filter.

Then, the D/A converter, to which a digital signal S1 is supplied by a signal input section 12, carries out D/A conversion by Delta-Sigma modulation and low-pass filtering and outputs a D/A converted analog signal Sout.

The signal input section 12 is provided based on each specification of various electronic equipments which execute D/A conversion using this D/A converter 8.

For example, when an FM radio receiver called "digital radio" or a hybrid radio receiver 13 is provided with the D/A converter 8, its receiving section 12, which generates a detected digital signal from an incoming radio wave, is provided as a signal input section 12. Namely, the D/A converter converts a digital signal S1 being output from the receiving section into the analog signal Sout.

In short, in the case of radio receiver 13, the signal input section 12 involves an RF amplifier, a frequency converter, an A/D converter, a frequency discriminator and a matrix circuit, for generating a detected signal from a received signal Sin obtained through an antenna.

The A/D converter carries out the analog-to-digital conversion to generate a digital signal, and the digital signal is applied with specified digital signal processing to generate a detected digital signal S1, and then, the signal S1 is supplied to the ΔΣmodulator 9.

The first post-filter 10 is a first-order analog low-pass filter, which is formed of, for example, a simple circuit composed of a resistor and a capacitor.

The second post-filter 11 is also a first-order analog low-pass filter similar to the first post-filter.

More precisely, as shown in FIG. 2b, the first post-filter 10 is a first-order analog low-pass filter having an attenuation characteristic Gb showing about 6 db/oct in attenuation in the range of frequencies higher than a predetermined cutoff frequency fcb.

Similarly, the second post-filter 11 is a first-order analog low-pass filter having an attenuation characteristic Ga similar to the attenuation characteristic Gb with a cutoff frequency fca.

Further, as shown in FIG. 2b, the cutoff frequency fca and fcb as mentioned above are set to satisfy the relation; fca<fcb. This retains the following relation; fHa<fHb, where fHb is a maximum frequency at which the attenuation of the first post-filter reaches a predetermined value of attenuation. In other words, the fHb is determined by a cross point of a curve illustrating an attenuation characteristic Gb of the first post-filter and the frequency axis, which represents the predetermined value of attenuation. Similarly, fHa of the second post-filter is also defined.

Furthermore, the cutoff frequency fcb of the first post-filter is set in the frequency range of the cutoff frequency fca of the second post-filter 11 and the maximum frequency fHa thereof.

Hereinafter, an operation of the above-mentioned D/A converter 8 will be explained.

After a digital signal S1 to be D/A converted is supplied to a ΔΣmodulator 9, a code sequence S2, which is generated from the digital signal S1 with Delta-Sigma modulation, is output to the first post-filter 10.

The first post-filter 10 attenuates the code sequence based on the attenuation characteristic Gb which suppresses undesired high-frequency noises over the cutoff frequency fcb with 6 dB/oct attenuation rate.

Next, the second post-filter 11 attenuates the signal S3 output from the first post-filter 10 based on the attenuation characteristic Ga which attenuates frequency components over the cutoff frequency fca with 6 dB/oct attenuation rate, and outputs the attenuated signal as an analog signal Sout.

The cutoff frequency fca and fcb are different, and the cutoff frequency fcb is set to fall in the range between the cutoff frequency fca and the maximum frequency fHa. Thus, the synthetic attenuation characteristics Gab, which is composed of the attenuation characteristics Ga and Gb, is as follows; the attenuation is about 0 dB in the frequency range less than the cutoff frequency fca, the attenuation rate is about 6 dB/oct in the frequency range of the cutoff frequency fca and fcb, and the attenuation rate is about 12 dB/oct in the range over the cutoff frequency fcb.

When the code sequence S2 passes through the first and second post-filters 10, 11, the undesired high-frequency noises over the cutoff frequency fcb are eliminated with the large attenuation rate of about 12 dB/oct, and in the range between the cutoff frequency fca and fcb the code sequence S2 is de-emphasized with the attenuation rate (the first-order filter characteristic) of about 6 dB/oct in frequency.

When a pre-emphasized code sequence S2 is input to the D/A converter 8, the D/A converter 8 executes elimination of the high-frequency noises and de-emphasis simultaneously, and the converted analog signal Sout is output with high-quality The D/A converter 8 in the present embodiment makes substantial reduction of the circuit scale possible, because the first and second post-filters 10, 11 are the first-order low-pass filter, respectively, which can be realized by simple circuits formed of resistors and capacitors.

As mentioned above, the first and second post-filters 10, 11 have different cutoff frequency fca and fcb, respectively, and thus the overall attenuation characteristic has the both of the first-order and second-order filter characteristics. That is, the elimination of undesired high-frequency noises is performed by the second-order filter characteristic, and also the attenuation characteristic as the first-order filter characteristic is suitable for the de-emphasis. It is an excellent effect of the present invention to have the both filter characteristics.

Furthermore, the fact that the first and second post-filters 10, 11 are the first-order low-pass filters leads to an effect of stabilization for behavior of the filter, compared with the post-filter implemented by a higher-order filter with the same attenuation characteristics Gab.

The conventional D/A converter described as a prior art (see FIG. 1a) employs the post-filter 7 (higher-order low-pass filter), which is placed at the subsequent stage of the Δ Σmodulator 6, being not for de-emphasis but for elimination of the undesired high-frequency noises. Thus, the de-emphasis circuit 3(a first-order digital low-pass filter), which is placed at the preceding stage of the Δ Σmodulator 6, is required for the de-emphasis function.

In contrast, the D/A converter of the present embodiment (see FIG. 2a) employs the first and second post-filters 10, 11, which are placed at the subsequent stage of the Δ Σmodulator 9, executing the elimination of undesired high-frequency noises and the de-emphasis. In view of attenuation characteristic, the overall characteristic Gab, synthesized from the two first-order attenuation characteristics Gb and Ga, has both the sharp attenuation characteristic suitable for elimination of undesired high-frequency noises and the attenuation characteristic suitable for de-emphasis.

Therefore, the D/A converter 8 in the present embodiment provides a new technique to implement the post-filter having two functions suitable for the elimination of undesired high-frequency noises and the de-emphasis.

In the above-mentioned embodiment, the desired attenuation characteristic Gab is obtained by the two post-filters 10, 11, but not limited to these two post-filters.

Furthermore, one or more lower-order filters maybe connected in cascade to the first or second post-filter 10, 11.

Each cutoff frequency of these lower-order filters including the first and second post filters 10, 11 may be adequately determined by adjusting the value of resistor and capacitor composing the filter, to obtain a desired overall attenuation characteristic.

These configurations make it possible to variously adjust the frequency characteristics in the analog signal Sout. This enables the D/A converter not only to de-emphasize but also to perform functions such as equalization or various adjustments of frequency characteristics.

These configurations, which are constructed of cascade-connected lower-order filters, also allow reduction of the circuit scale and stabilization for the overall behavior of filter.

Next, a more specific example of the above-mentioned embodiment will be explained referring to FIGS. 3a and 3b, and FIGS. 4a and 4b.

This example relates to a hybrid FM radio receiver. In FIGS. 3a and 3b and FIGS. 4a and 4b, parts corresponding to those in FIGS. 2a and 2b are indicated with the same reference numbers or codes.

Figure 3:
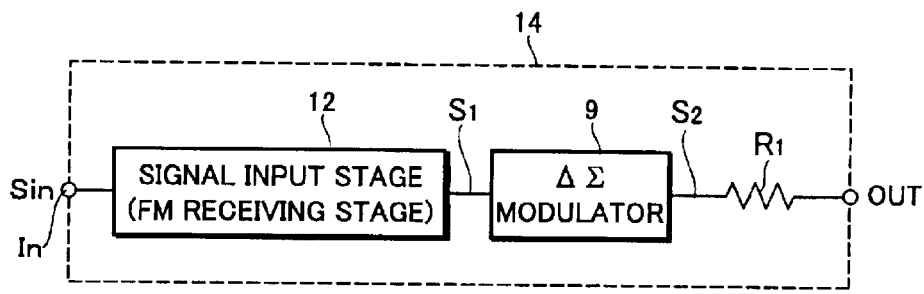
FIG. 3a and FIG. 3b show a configuration of a semiconductor integrated circuit device for a radio receiver and a D/A converter of an example of the present embodiment.
Figure 3:
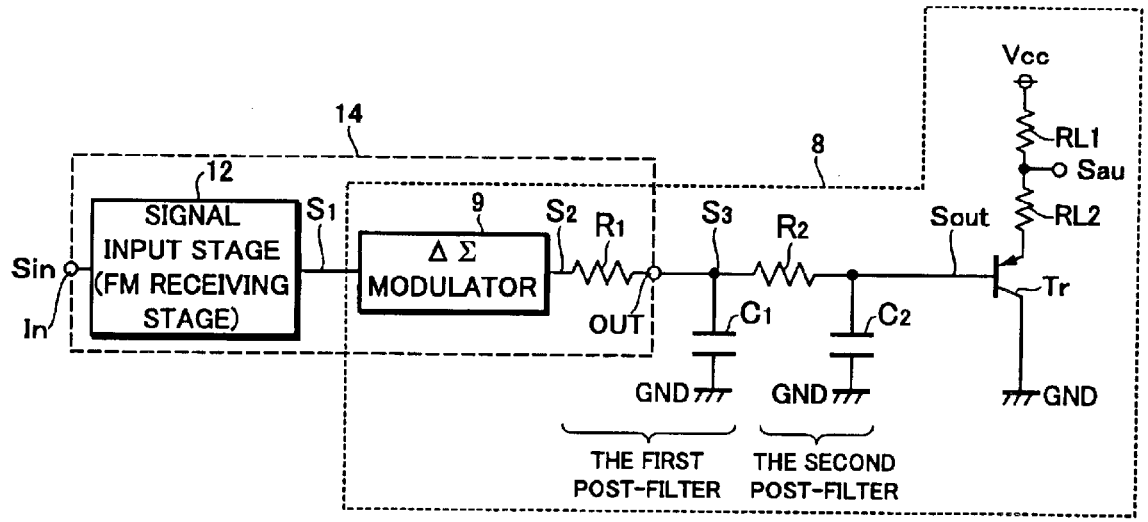

FIG. 3a is a block diagram illustrating a semiconductor integrated circuit device 14 developed for a radio receiver of the present embodiment.

The semiconductor integrated circuit device 14 involves an input terminal In for inputting a received signal Sin received through an antenna, a signal input section 12 connected to the input terminal In, a Δ Σmodulator 9 and a resistor R1 placed between the Δ Σmodulator 9 and an output terminal OUT.

The signal input section 12 operates as an FM receiving section for generating a detected signal from the received signal Sin.

More specifically, the signal input section 12, whose aim is to generate an FM detected signal (also called FM demodulated signal) from a radio wave received from a radio station, involves analog circuits such as an RF amplifier and a frequency converter, an A/D converter for converting an intermediate frequency signal (IF signal) generated from the frequency converter to a digital signal, a frequency discriminator for discriminating frequency with a digital signal processing to be applied to the digital signal being output from the A/D converter, and a matrix circuit.

Then, the FM detected signal, which is generated from the above-mentioned frequency discriminator and matrix circuit, is supplied to the Δ Σmodulator 9 as a digital signal S1 to be D/A converted.

The resistor R1 is so called "an inner resistor" of semiconductor element, which is formed in the semiconductor integrated circuit device 14 in advance through semiconductor fabrication processing. The R1 transmits a code sequence S2 from the Δ Σmodulator 9 to the output terminal OUT.

Thus, the signal input section 12, involving the RF amplifier for generation of the FM detected signal and the matrix circuit, the Δ Σmodulator 9 and the resistor R1 are constructed in the semiconductor integrated circuit device 14.

The radio receiver of the present embodiment, shown in FIG. 3b, is constructed with the semiconductor integrated circuit device 14 to be connected with predetermined external electronic elements.

That is, in FIG. 3b, a first capacitor C1 is connected with the output terminal OUT of the device 14 in parallel which is followed by a resistor R2 in series, and the resister R2 is followed by a second capacitor C2 in parallel.

Furthermore, the base of a transistor Tr (PNP-typed) is connected to the connection point of resistor R2 and the second capacitor C2, the emitter of the Tr is connected to a power supply terminal Vcc through resistors RL2 and RL1, and the collector of the transistor Tr is connected to a ground terminal GND.

The operation of the above-mentioned radio receiver will be explained.

The received signal Sin, which is an incoming radio wave from a radio station through an antenna, is supplied to the signal input section (FM receiving section) 12 which then supplies the digital signal S1 to be D/A converted to the Δ Σmodulator 9.

The Δ Σmodulator 9 applies Δ Σmodulation (also called "Sigma-Delta modulation") to the digital signal S1 to generate the code sequence S2.

The first post-filter 10 is composed of the resistor R1 previously fabricated in the semiconductor integrated circuit device 14 and the first capacitor C1 formed externally, and the second post-filter 11 is also composed of the resistor R2 and the second capacitor C2, both of which are formed externally.

Figure 4:
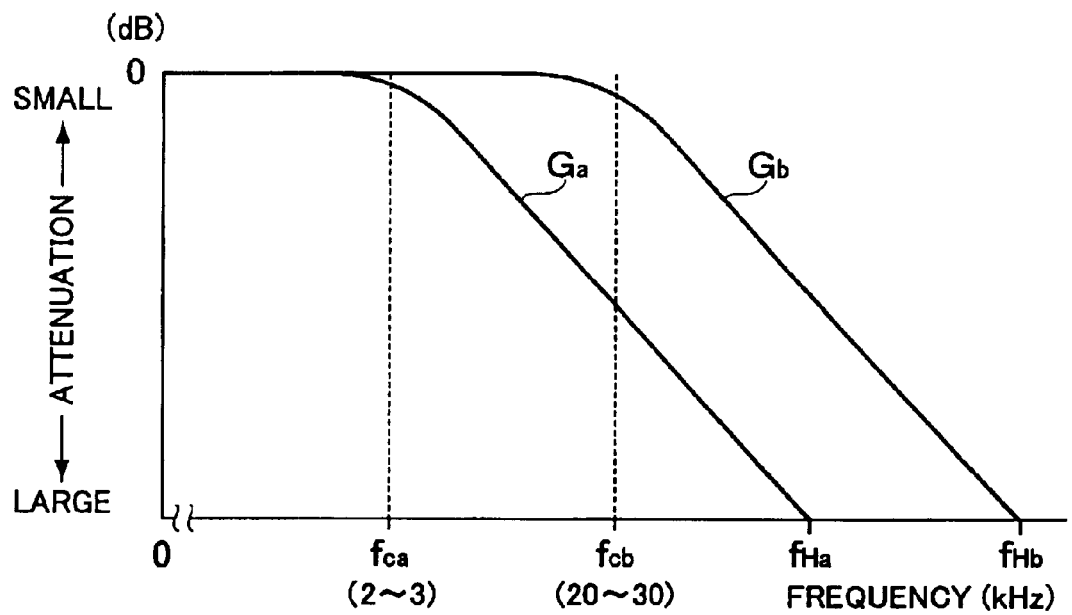
FIG. 4a and FIG. 4b show the characteristics of the D/A converter illustrated in FIGS. 3a and 3b.
Figure 4:
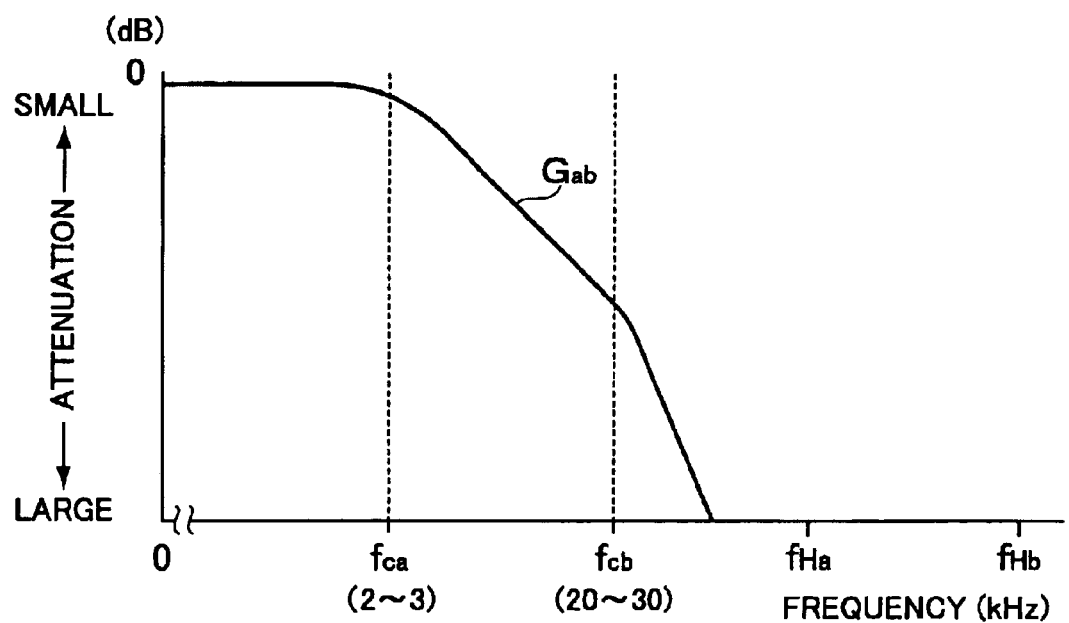

More specifically, as shown in FIG. 4a, the above first post-filter 10 is a first-order analog low-pass filter formed of the resistor R1 and the first capacitor C1, whose cutoff frequency fcb is set in the range of 20 to 30 kHz in frequency and whose attenuation characteristic Gb shows the rate of about 6 dB/oct in the frequency range over the cutoff frequency fcb.

The above second post-filter 11 is also a first-order analog low-pass filter formed of the resistor R2 and the second capacitor C2, whose cutoff frequency fca is set in the frequency range of 2 to 3 kHz and whose attenuation characteristic Ga shows the rate of about 6 dB/oct in frequency range over the cutoff frequency fca.

Therefore, a signal S3 attenuated with the attenuation characteristic Gb is output to the output terminal OUT, and a signal Sout attenuated with the attenuation characteristic Ga is output to the connection point of the resistor R2 and the second capacitor C2.

In other words, as shown in FIG. 4b, the two resistors R1 and R2 and the two capacitors C1 and C2 compose a second-order low-pass filter having the attenuation characteristic Gab, therefore, the undesired high-frequency noises over the cutoff frequency fcb can be eliminated, and the de-emphasized analog signal Sout is output to the connection point of the resistor R2 and the second capacitor C2.

Then, the transistor Tr amplifies the analog signal Sout, and then the resistors RL1 and RL2 adjust the amplified signal to output an analog signal Sau in which a speaker or the like is driven based on the analog signal Sau to reproduce sounds.

Therefore, the radio receiver of the present embodiment makes it possible to reduce the circuit scale, because the second-order analog low-pass filter for eliminating the undesired high-frequency noises and for the de-emphasis is implemented by a simple circuit configuration composed of the semiconductor integrated circuit device 14 in which the resistor R1 is formed beforehand, and the resister R2, the capacitors C1 and C2.

In addition, the resistor R1 in the semiconductor integrated circuit device 14 absorbs pulse-shaped harmonics noises which are generated by Delta-Sigma modulation in the Δ Σmodulator 9 when generating the code sequence S2 so that radiant noise powers in harmonics can be suppressed. Therefore, this causes substantial suppression of bad influence of harmonics noise on the inner circuits in this radio receiver and bad influence on its peripheral electronic apparatus.

Because the present embodiment employs the configuration, having a cascade connection of the Δ Σmodulator 9, the first and second post-filters in this order, the resistor R1 in the device 14 is not always required to be high-accuracy. This gives good effects on the fabrication yield of the semiconductor integrated circuit device 14.

More in detail, even if the resistor R1 is formed of such a resistor having not always high-accuracy as a pinch resistor or the like, the first post-filter, whose main purpose is elimination of high-frequency noises, can perform good function for eliminating noises, because the cutoff frequency fcb need not be set with high-accuracy for the function. In contrast, the cutoff frequency fca of the second post-filter needs to be set with high-accuracy to properly execute the de-emphasis. Being not affected by the resistor R1, the cutoff frequency fca is able to be set with high-accuracy using the resistor R2 and the second capacitor c2 as provided outside.

The configuration of the D/A converter, in which the first post-filter uses the resistor R1 and the second post-filter is connected to the first post-filter in cascade, does not always require the high-accuracy resistor R1. Thus, this causes good fabrication yield of the semiconductor integrated circuit device 14 and improvements in design flexibility.

In addition, when the resistor R1 is made with such a fabrication process with high-accuracy as ion injection method or the like, the first post-filter may be formed for de-emphasis and the second post-filter for elimination of noises, by setting the values of the capacitor C1 and C2 and the resistor R2 to perform the respective function.

That is, a filter performing the de-emphasis may be composed of the resistor R1 and the first capacitor C1, and another filter performing the elimination of high-frequency noises may be composed of the resistor R2 and the capacitor C2.

As shown in FIG. 3b, an impedance conversion circuit composed of the transistor Tr and the resistor RL1 and RL2 is connected to the output of the second post-filter. When such a subsequent circuit as a tone-control circuit is connected to the connected point of the resistor RL1 and RL2, therefore, the analog signal Sau is able to be supplied to a subsequent circuit without its power loss.

If a subsequent circuit is connected to the connection point of the resistor R2 and the capacitor C2 composing the second post-filter without the above-mentioned impedance conversion circuit, the analog signal Sout is not able to be supplied efficiently to the subsequent circuit, because output impedance of the second post-filter is high. On the contrary, using the above impedance conversion circuit, the analog signal Sau corresponding to the signal Sout is able to be supplied efficiently to the subsequent circuit, because the output impedance of the impedance conversion circuit is much lower.

Furthermore, even when the digital signal S1 to be D/A converted is so called "small signal", the analog signal Sau can be generated with high S/N and less distortion.

Figure 1:
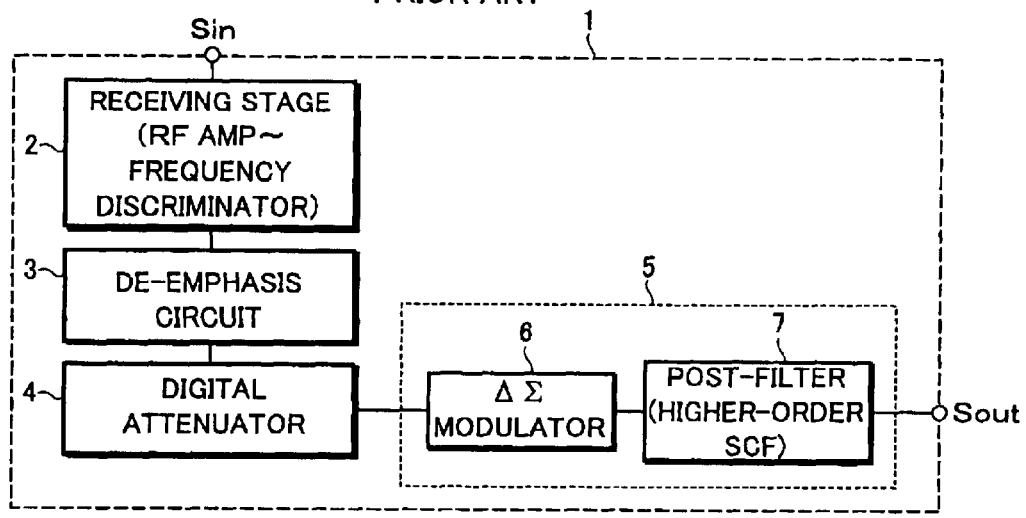
FIG. 1a through FIG. 1c show a conventional structure and its characteristics of a semiconductor integrated circuit device involving a D/A converter inside, which is proposed for a radio receiver.
Figure 1:
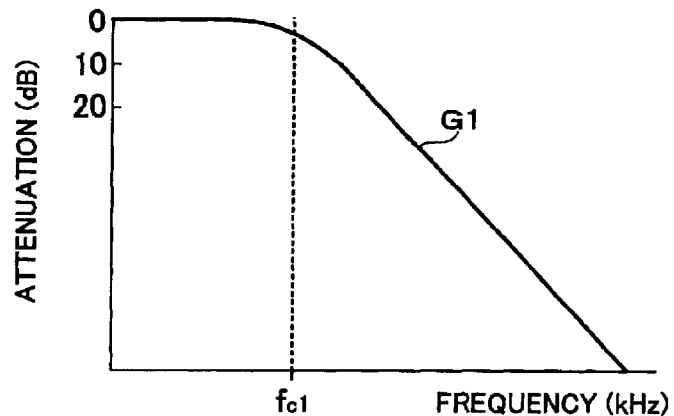
Figure 1:
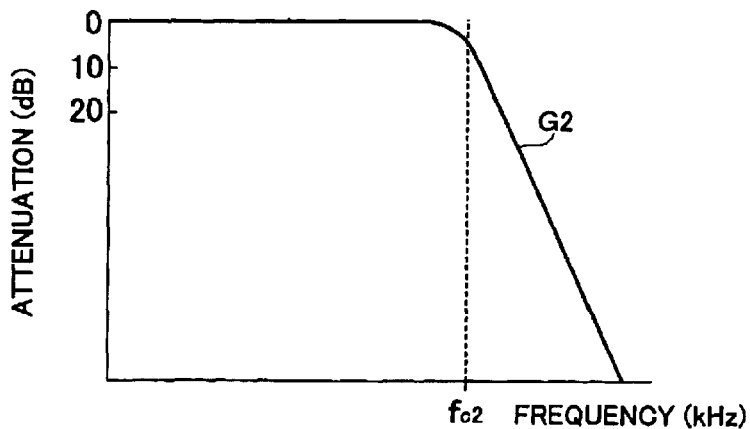

That is, the conventional radio receiver, shown in FIG. 1a, adjusts the analog signal levels after D/A conversion by the digital attenuator 4 for level-adjustment provided at the preceding stage of the Δ Σmodulator 6. This conventional configuration causes problems such as generation of distortions in the analog signal Sout or reduction of S/N, when the digital signal being to be D/A converted is not sufficiently large comparing with the resolution ability of 1 LSB in the Δ Σmodulator.

In contrast, in the present embodiment shown in FIGS. 3a and 3b, the Delta-Sigma modulation is executed to the digital signal S1 by the Δ Σmodulator 9 without loss of effective bits of the digital signal S1, even when the digital signal S1 is so called "small signal". Next, after generating the analog signal Sout through the first and second post-filters, the analog signal Sau is output with the adjusted level through amplification by the transistor Tr, and then using voltage divided by the resistor RL1 and RL2 connecting in cascade to the emitter of the transistor Tr.

That is, the present embodiment allows generation of the analog signal Sau with no distortion and high S/N, because of D/A conversion of the digital signal S1 without loss of effective bits of the signal S1 and with level-adjustment of the generated analog signal Sout using the resistor RL1 and RL2.

As mentioned above, a D/A converter in the present embodiment allows substantial reduction of the circuit scale, because the post-filters 10 and 11 are formed of a first-order low-pass filter, respectively, for low-pass filtering the code sequence after Delta-Sigma modulation. Particularly, the first-order low-pass filters which can be formed of a simple circuit combined of the resistor R1 and R2 and capacitor C1 and C2, cause substantial reduction of the circuit scale.

Furthermore, if each of the first and second post-filters 10 and 11 has different cutoff frequency fca and fcb, the attenuation characteristic Gab can be attained with the specific characteristic of the second-order filter having both the first-order and second-order characteristics. This enables the D/A converter to execute two processes: one is the de-emphasis using the attenuation characteristic of the first-order filter, the other is the elimination of undesired high-frequency noises using the sharp attenuation characteristic of the second-order filter. Thus, the D/A converter having a small circuit scale and higher functions can be provided.

While there has been described what are at present considered to be preferred embodiments of the present invention, it will be understood that various modifications may be made thereto, and it is intended that the appended claims cover all such modifications as fall within the true spirit and scope of the present invention.

What is claimed is:

1. A digital-to-analog converter for converting a digital signal to an analog signal comprising:
   a modulator for applying Delta-Sigma modulation to the digital signal to generate a code sequence;
   a first post-filter having a first-order attenuation characteristic of performing low-pass filtering to the code sequence; and
   a second post-filter having another first-order attenuation characteristic of performing low-pass filtering to an output signal from said first post-filter, and for outputting the processed analog signal;
   wherein a cutoff frequency of said first post-filter is set in a frequency range between a cutoff frequency of said second post-filter and a maximum frequency at which the attenuation of said second post-filter reaches a predetermined value of attenuation, in order to simultaneously execute processing such as de-emphasis in a frequency range between said cutoff frequency of said second post-filter and said first post-filter, and elimination of high-frequency noise over said cutoff frequency of said first post-filter.

2. The digital-to-analog converter according to claim 1, wherein the cutoff frequency of said first post-filter is set in a frequency range of 20 to 30 kHz, and the cutoff frequency of said second post-filter is set in a frequency range of 2 to 3 kHz.

3. The digital-to-analog converter according to claim 1, wherein each of said first and second post-filters is a first-order analog low-pass filter composed of a resistor and a capacitor.

4. The digital-to-analog converter according to claim 3, wherein said resistor composing said first post-filter is connected to an output of said modulator and is fabricated in a semiconductor integrated circuit device together with said modulator.

5. The digital-to-analog converter according to claim 4, wherein said semiconductor integrated circuit device is provided with an FM receiving section placed at a preceding stage of said modulator.

6. The digital-to-analog converter according to claim 5, wherein said FM receiving section comprises an RF amplifier, a frequency converter, an A/D converter, a frequency discriminator and a matrix circuit to generate a detected signal from a received signal.

7. The digital-to-analog converter according to claim 1, further comprising:
   an impedance converter connected to a subsequent stage of said second post-filter, to convert impedance of the analog signal being output from said second post-filter.

8. The digital-to-analog converter according to claim 7, further comprising:
   voltage dividing resistors for dividing a voltage of the analog signal being output from said impedance converter.

9. A digital-to-analog converter for converting a digital signal to an analog signal comprising:
   a modulator for applying Delta-Sigma modulation to the digital signal to generate a code sequence;
   a first post-filter having a first-order attenuation characteristic of performing low-pass filtering to the code sequence;
   a second post-filter having another first-order attenuation characteristic of performing low-pass filtering to an output signal from said first post-filter, and for outputting the processed analog signal;
   an impedance converter connected to a subsequent stage of said second post-filter, to convert impedance of the analog signal being output from said second post-filter; and
   voltage dividing resistors for dividing a voltage of the analog signal being output from said impedance converter, wherein
   said first and second post-filters have different cutoff frequencies.

10. A digital-to-analog converter for converting a digital signal to an analog signal comprising:
    a modulator for applying Delta-Sigma modulation to the digital signal to generate a code sequence;
    a first post-filter having a first-order attenuation characteristic of performing low-pass filtering to the code sequence; and
    a second post-filter having another first-order attenuation characteristic of performing low-pass filtering to an output signal from said first post-filter, and for outputting the processed analog signal,
    wherein said first and second post-filters have different cutoff frequencies,
    wherein each of said first and second post-filters is a first-order analog low-pass filter composed of a resistor and a capacitor,
    wherein said resistor composing said first post-filter is connected to an output of said modulator and is fabricated in a semiconductor integrated circuit device together with said modulator,
    wherein said semiconductor Integrated circuit device is provided with an FM receiving section placed at a preceding stage of said modulator, and
    wherein said FM receiving section comprises an RE amplifier, a frequency converter, an A/D converter, a frequency discriminator and a matrix circuit to generate a detected signal from a received signal.

* * * * *